United States Patent [19]

Grabbe et al.

[11] 4,354,729
[45] Oct. 19, 1982

[54] PRELOADED ELECTRICAL CONTACT TERMINAL

[75] Inventors: Dimitry G. Grabbe, Lisbon Falls, Me.; Iosif Korsunsky, Harrisburg, Pa.

[73] Assignee: AMP Incorporated, Harrisburg, Pa.

[21] Appl. No.: 219,085

[22] Filed: Dec. 22, 1980

[51] Int. Cl.³ ............................................. H01R 13/12
[52] U.S. Cl. ............................ 339/258 R; 339/17 CF; 29/874
[58] Field of Search ...... 339/17 CF, 75 MP, 176 MP, 339/258 P, 258 R; 113/119

[56] References Cited

U.S. PATENT DOCUMENTS

| | | | |
|---|---|---|---|
| 3,120,988 | 2/1964 | Gilbert | 339/176 |
| 3,149,899 | 9/1964 | Johanson | 339/258 |
| 3,744,005 | 7/1973 | Sitzler | 339/176 MP X |
| 3,771,100 | 11/1973 | Reed | 339/17 LM |
| 3,871,736 | 3/1975 | Carter | 339/221 R |
| 3,989,336 | 11/1976 | Rizzio, Jr. et al. | 339/74 R |
| 4,109,986 | 8/1978 | Mouissie | 339/176 MP X |
| 4,262,986 | 4/1981 | Cherian et al. | 339/17 CF X |

OTHER PUBLICATIONS

O.G., p. 1636-Pat. No. 4,050,755.

Primary Examiner—Joseph H. McGlynn
Assistant Examiner—Timothy V. Eley
Attorney, Agent, or Firm—Frederick W. Raring

[57] ABSTRACT

Electrical contact terminal of the flat coplanar type which is manufactured by stamping sheet metal, has a yoke portion having a latch arm and a spring arm extending therefrom. The latch arm is relatively short while the spring arm is of sufficient length to permit deflection thereof when the terminal is placed in service. The two arms have free ends which are adjacent to and resiliently biased against each other. The free ends are latched to each other by latching means which permits movement of the free end of the spring arm along a side edge of the latch arm. An edge portion of the spring arm serves as a contact portion and current flows from this contact portion to the end of the spring arm then to the latch arm and to the yoke portion of the terminal to provide a short low inductance current path for the current. The spring arm is in a preloaded and flexed condition so that an elevated contact pressure is achieved.

12 Claims, 9 Drawing Figures

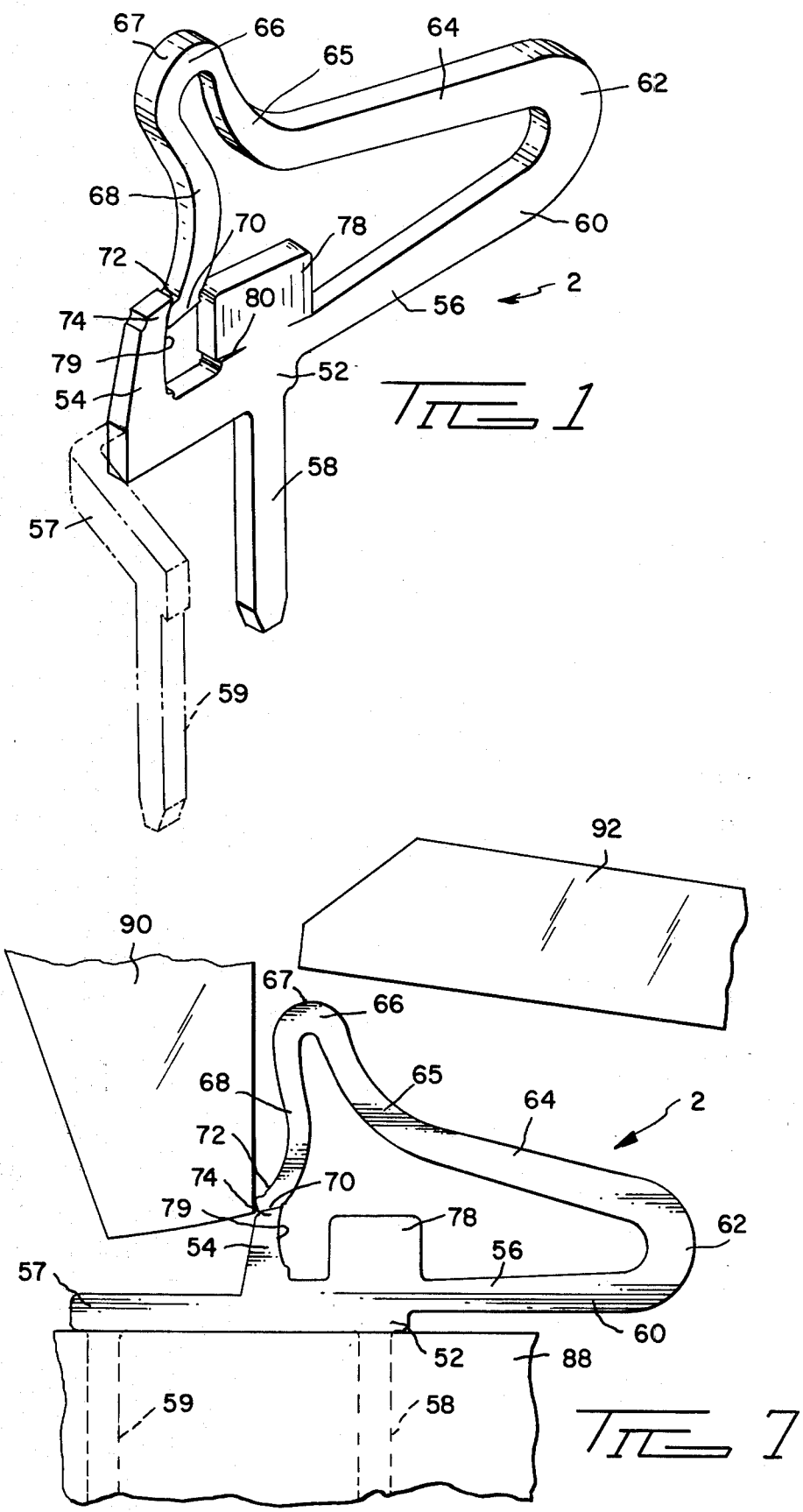

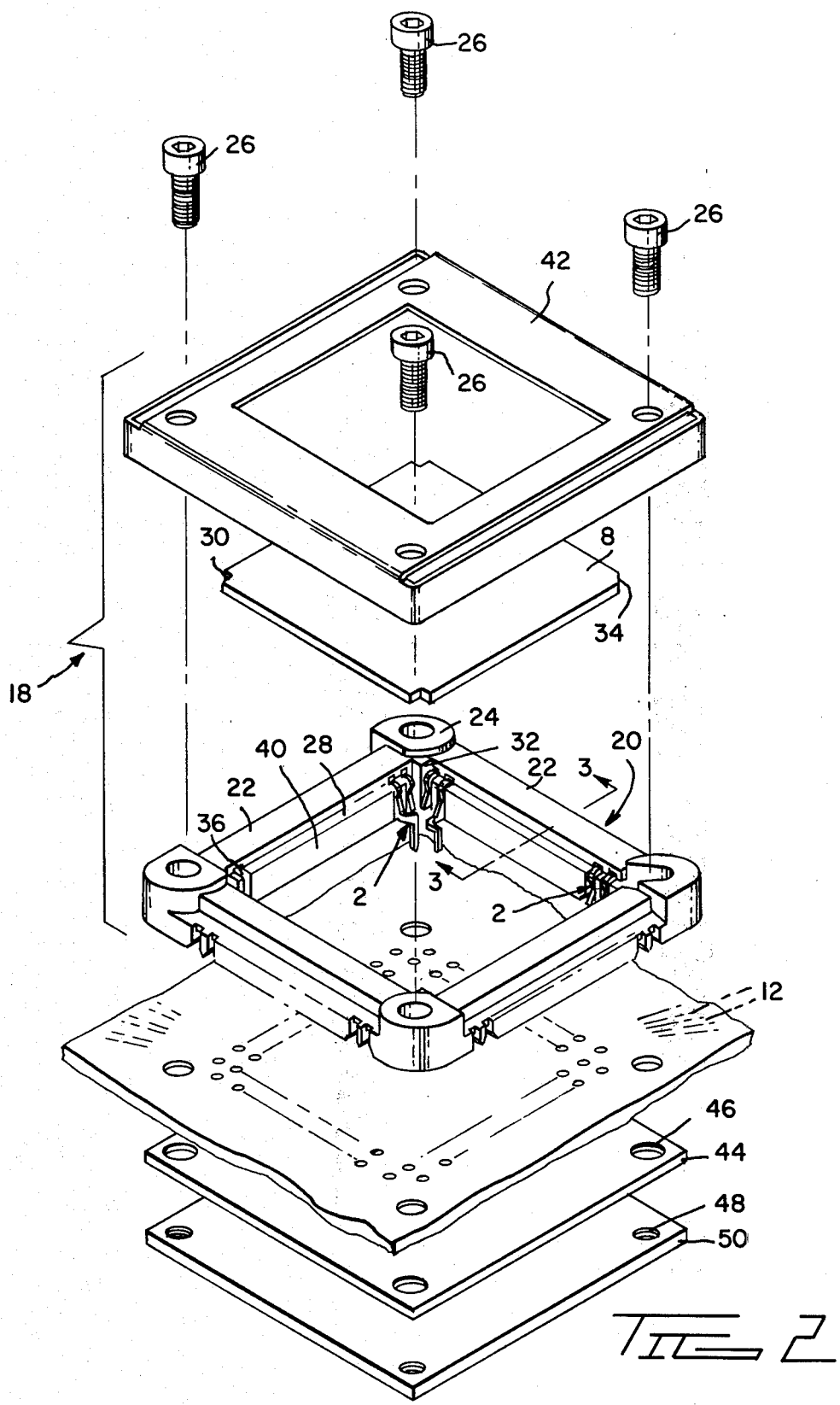

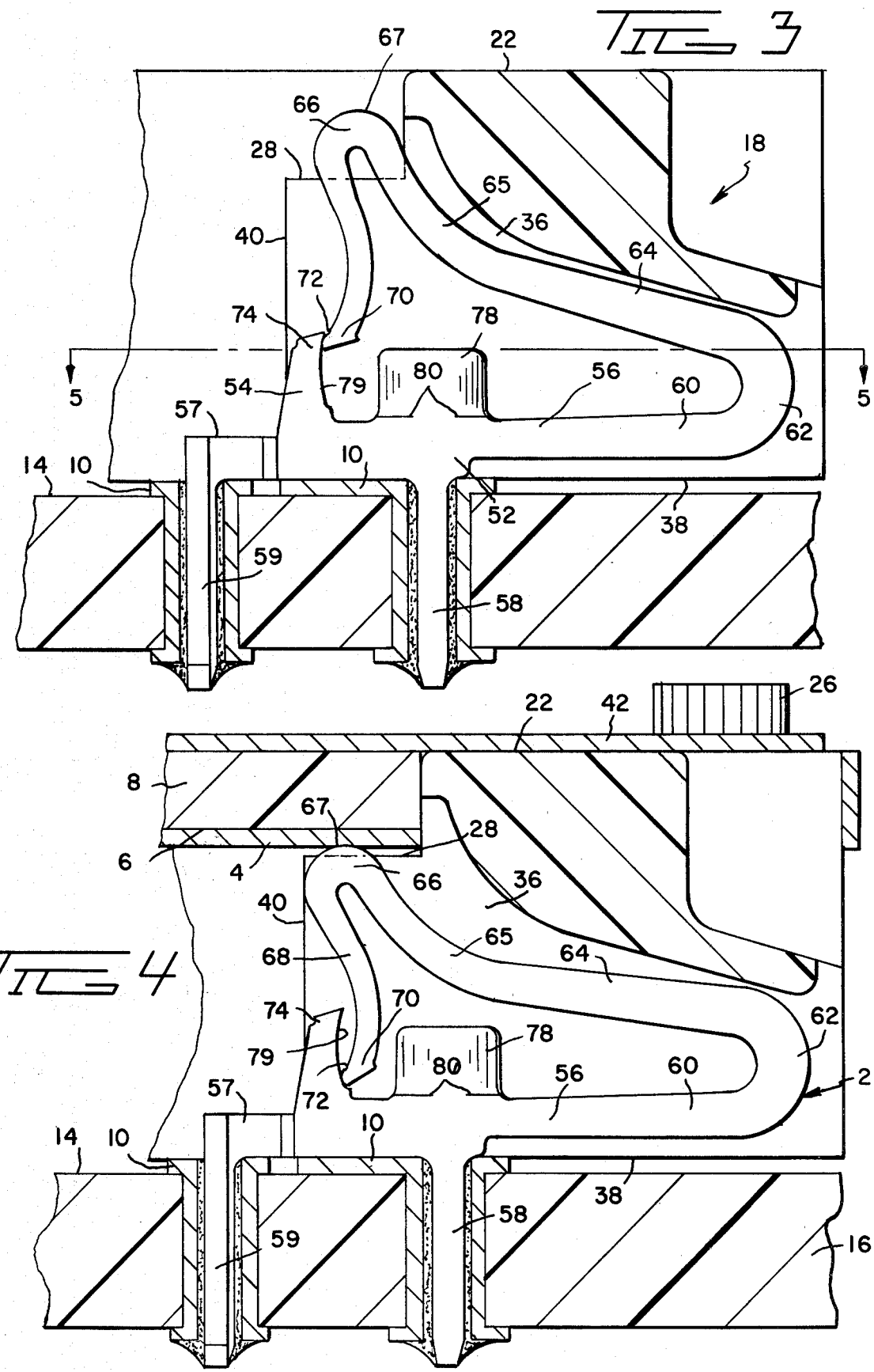

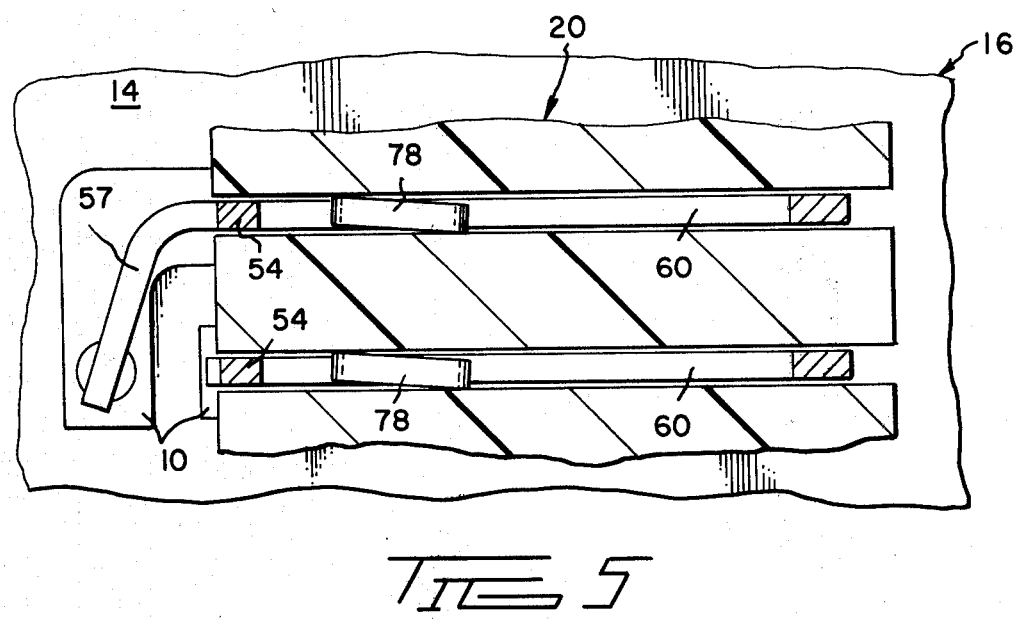

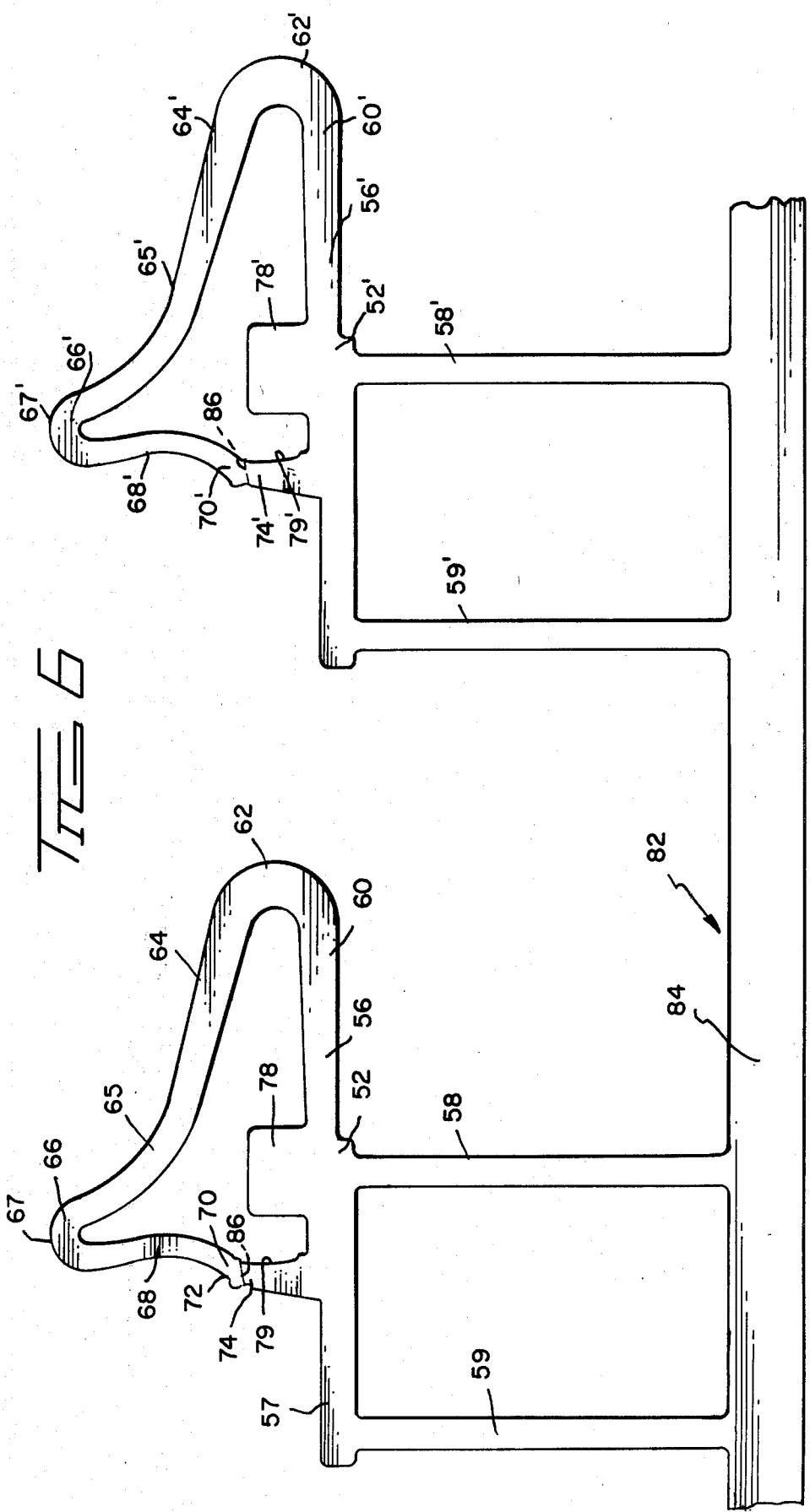

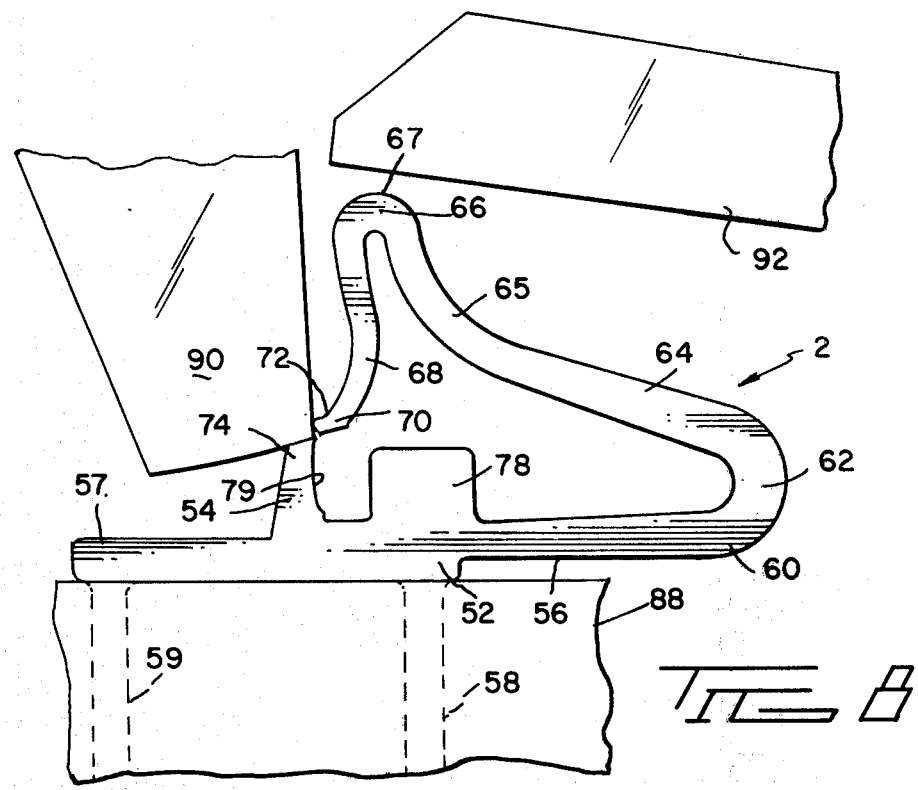
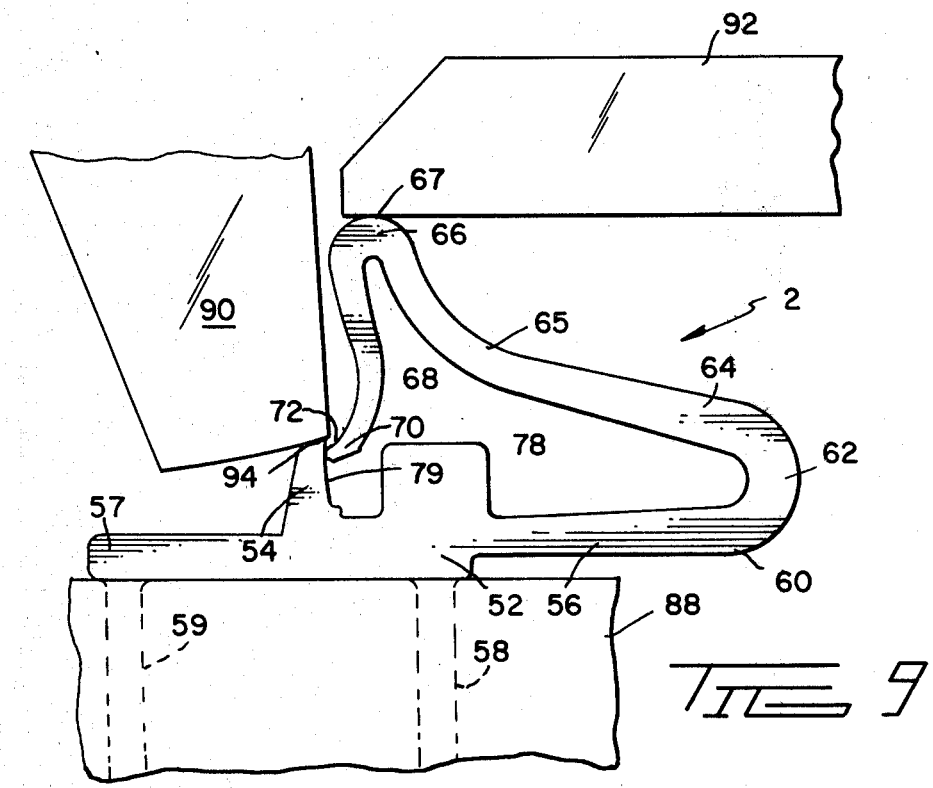

PRELOADED ELECTRICAL CONTACT TERMINAL

FIELD OF THE INVENTION

This invention relates to electrical connectors of the type used to connect terminal pads on a substrate or the like to terminal pads on a circuit board. The invention further relates to improved contact terminals for connectors which can be produced in extremely small sizes, which exhibit low self-inductance effects, and which are capable of providing predetermined and relatively high contact forces.

BACKGROUND OF THE INVENTION

A wide variety of electrical connectors are available for providing conducting paths between terminal areas or terminal pads on a substrate or a printed circuit daughter board and conductors on a printed circuit mother board or the like. An equally wide variety of terminals are used in these connectors for the many specialized circumstances which are encountered in the electrical and electronics industry. The most common type of terminal used in electrical connectors is the stamped and formed sheet metal type which is manufactured by first stamping a flat blank for the terminal and then bending or forming the blank normally of its own plane to produce the desired configuration in the finished terminal. The terminal will always have a contact portion which engages a terminal pad on the circuit board or substrate and an integral spring means, usually in the form of a spring arm on the end of which the contact portion is located. Since the spring arm is flexed normally of the plane of the metal from which the terminal was formed, a specific terminal can be designed which will satisfy any set of performance characteristics, particularly deflection and contact force, within wide ranges. Because of the fact that the terminal is produced by forming or bending the flat blank after it is stamped, terminals of this type must, as a practical matter, be of some minimum thickness as measured between their oppositely facing sides. The sides of a terminal of this type are usually the edges of the blank and the surfaces extending between the sides were originally surfaces of the stock metal. This restriction that the terminal must have some minimum width for practical manufacturing reasons has not, however, been troublesome in the past under most circumstances.

An alternative type of sheet metal terminal is produced by simply stamping the blank to the form of the finished terminal so that the surfaces of the sheet metal from which the terminal is stamped become the side surfaces of the finished terminal. The thickness of a terminal of this type, which can be described as being coplanar, is then equal to the thickness of the metal stock from which the terminal was produced. In general, complanate terminals can thus be produced in forms which are much thinner than conventional stamped and formed terminals. A shortcoming of previously known coplanar type terminals is that the elements of the terminal, such as the spring means, are relatively stiff and resistant to flexure and to obtain even a small amount of flexure in the terminal, it has been necessary in the past to make the terminals with long, sometimes serpentine spring arms so that the terminal will deflect as desired when it is put to use. Furthermore, the terminal in producing a coplanar type terminal, has been limited with respect to his control over the contact force which will be developed by the terminal in use. Probably because of these shortcomings of flat terminals, their use has been somewhat restricted in the past.

Electrical and electronic equipment of types in limited use at this time and being designed for future use require extremely close spacing of the terminals in the connectors for the equipment, and it is becoming increasingly difficult to design connectors with conventional stamped and formed contact terminals therein, for such equipment. Accordingly, the complanate type terminal is becoming increasingly attractive for these new generations of connectors.

The present invention in accordance with one aspect thereof is directed to the achievement of an improved flat coplanar terminal which overcomes the shortcomings of previous terminals of this type; specifically, the invention is directed to the achievement of a terminal which is capable of a substantial amount of deflection when it is put to use and which will produce a high and precisely predetermined contact force.

In accordance with a further aspect thereof, the invention is directed to the achievement of a terminal which exhibits relatively low self-inductance effects when placed in service. Self-inductance in electrical contact terminals has not been considered a significant problem in the past, for the reason that the switching time for most equipment was relatively long and inductance could therefore be ignored. Electrical equipment now being designed, however, may have switching times of $10^{-9}$ seconds and while the current flowing through an electrical contact may be relatively low, this extremely short switching time can give rise to significant self-inductance effects which may interfere with the proper operation of the equipment. It might be added that self-inductance effects become pronounced if the terminal is designed such that the circuit path through the terminal is relatively long and is other than a straight line. In general, the shorter the circuit path through the terminal, the lower the inductance produced during a switching operation.

One form of electrical contact terminal in accordance with the invention comprises a flat stamped terminal device having a yoke portion from which a latch arm and a spring arm extend. The latch arm is relatively short and has a free end which is adjacent to the yoke portion. The spring arm is relatively long and is provided with a reverse curve intermediate its ends so that it is capable of undergoing substantial deflection, notwithstanding the fact that the terminal is of the flat coplanar type. An edge portion of the spring arm which is adjacent to the free end of the spring arm serves as a contact portion which engages the terminal pad on a substrate or the like, when the terminal is put to use. The free end of the spring arm is against and latched to the free end of the latch arm by means of a latching device which permits the spring arm to flex. The spring arm is furthermore in a stressed and flexed condition, by virtue of the fact that its free end is displaced from the normal position thereof to its latched position against the latch arm. The prestressed condition of the spring arm provides an elevated contact force for the electrical contact with the substrate when the terminal is put to use.

DRAWINGS

FIG. 1 is a perspective view of a contact terminal in accordance with the invention.

FIG. 2 is a perspective view of a connector containing contact terminals of the type shown in FIG. 1, the parts of the connector being exploded from each other.

FIG. 3 is a view taken along the lines 3—3 of FIG. 2 but with the parts assembled to each other.

FIG. 4 is a view similar to FIG. 3 but showing the position of the parts when the substrate is assembled to the connector.

FIG. 5 is a view taken along the lines 5—5 of FIG. 3.

FIG. 6 is a plan view of a short section of a strip of terminal blanks.

FIG. 7 is a side view showing a blank positioned adjacent to tooling members which function to move the spring arm of the terminal to its latch position.

FIGS. 8 and 9 are views similar to FIG. 7 illustrating the manner in which the spring arm is displaced to its latched position.

PREFERRED EMBODIMENT

An electrical contact terminal 2, FIG. 1, in accordance with the invention is intended for use in a connector 18 as shown in FIG. 2 which serves to provide conducting paths between terminal pads 4 on the underside 6 of a substrate 8 and terminal pads 10 on the ends of conductors 12 which are on the upper side 14 of a circuit board 16.

The connector 18 comprises a rectangular frame member 20 of suitable insulating material which is centrally open and which is formed of four side rails 22 having enlarged corners 24. Openings are provided in the corners for screws 26 which secure the connector to the circuit board and which clamp the substrate against the contact terminals in the connector.

The internal surface 40 of each of the side rails 20 is provided with a ledge 28 which supports the margins of the underside of the substrate 8 when the substrate is positioned in the connector. The corners of the substrate are notched, as shown at 30, and these notches receive wedge-shaped projections 32 in the corners of the housing, one corner 34 of the substrate being beveled for cooperation with a spring member (not shown) in the housing which biases the remaining three corners against the wedge members 32 thereby accurately to position the substrate in the connector.

A plurality of slot-like cavities 36 are provided in the housing side rails in side-by-side relationship, each cavity extending inwardly from the lower surface 38 of the housing and inwardly from the inner surface 40 of the side rail. These cavities intersect and open onto the ledge 28 as shown in FIG. 3 so that portions of each terminal will project above the ledge.

The substrate 8 is retained in the housing by means of a square metallic clamping frame 42 which fits over the substrate and over the upper surface of the housing. The screws 26 extend through holes in the corners of the frame, through the housing, through oversize holes in the circuit board 16, and through oversized holes 46 in a plastic insulating plate 44. The screws are threaded into threaded holes 48 in a metallic clamping plate 50 so that the stresses developed as a result of clamping the substrate against the contacts are not borne by the circuit board.

The individual terminals 2 each has a yoke portion 52 from which solder tabs 58, 59 extend. The solder tab 58 extends directly from the yoke portion while the solder tip 59 extends from the end of a connecting arm 57 which is integral with the left hand side of the yoke portion. When an individual terminal is assembled to the housing, one of the solder tabs, 58 or 59, is removed from the terminal and the remaining solder tab is inserted into a circuit board hole, as shown in FIG. 5. The terminal pads on the side 14 of the circuit board are of the conventional IL type and those terminals which have arms 57 and solder tabs 59 extending therefrom are connected to the L-type terminal pads, as also shown in FIG. 5. Under some circumstances, both of the solder tabs 58, 59 may be removed and the lower edge of the yoke portion soldered to the terminal areas on the upper surface of the circuit board.

The cavities in the housing are relatively narrow and have parallel spaced-apart sidewalls which are adjacent to the side surface of the terminals so that the terminals are retained in a prestressed and latched condition which is described below. The individual terminals are retained in their cavities by means of retaining ears 78 which extend upwardly from the upper edge of the yoke portion of the terminal. These ears are partially sheared as shown at 80, adjacent to the yoke portion and are formed slightly outwardly from the plane of the yoke portion so that the ears provide an interference fit of each terminal in its cavity.

Each terminal has a latch arm 54 and a spring arm 56 extending from its yoke portion. The spring arm 56 has a first portion 60 which extends laterally away from the yoke and is reversely curved at 62. The spring arm extends from the curve as shown at 64 back towards the lefthand end of the terminal and is again curved at 65 so that a U-shaped section is formed which is spaced from the latching arm 78. The outwardly facing edge 67 of this U-shaped portion serves as a contact portion for the terminal as will be described below. An end portion of the terminal 68 extends from the reverse curve 66 down to the free end 70 of the spring arm and the outwardly facing edge 72 of this free end is against the rightwardly facing edge 79, as viewed in FIG. 1, of the latch arm 54. The upper free end 74 of the latch arm extends arcuately over the surface 72 on the free end of the spring arm so that the spring arm is restrained from moving leftwardly from the position as shown.

The terminal in the condition shown in FIG. 1 is in a flexed and stressed condition in that the free end 70 of the spring arm is displaced from the normal position of this spring arm to the latched position shown. The normal position of the free end of this arm would be adjacent to, and slightly beyond, the free end of the latch arm and the entire upper portion of the spring arm would, therefore, normally be displaced upwardly from the position shown. Additionally, the latch arm and the spring arm are resiliently biased against each other as a result of the fact that the spring arm is displaced from its normal position.

FIG. 6 shows the blank from which the terminal of FIG. 1 is produced and FIGS. 7-9 illustrate the manner in which the spring arm of the terminal is moved to a displaced position and thereby prestressed when it is positioned in the housing. As shown in FIG. 6, the terminal blank has the free end 74' of the latch arm integral with the free end 70' of the spring arm. Subsequent to stamping, the free ends 74', 70' are separated from each other by shearing the blank along a shear line 86 which defines the upper end of the latch arm and the lower end of the spring arm, as viewed in FIG. 6.

After the shearing operation has been carried out, the terminal strip is fed by means of a guide 88 to locate the leading terminal of the strip adjacent to tools 90, 92, FIG. 7, which move the free end of the spring arm to its displaced position from its normal position which is shown in FIG. 7. The tool 90 engages the free end of the spring arm and moves generally arcuately from the position of FIG. 7 to the position of FIG. 8, thereby pushing the free end of the spring arm beyond the edge 79 of the latch arm. When the free end of the spring arm is moved rightwardly in this manner, the entire spring arm is, of course, stressed to some extent. The tool 92 then moves downwardly from the position of FIG. 8 to the position of FIG. 9 and engages the spring arm at the reverse curve 66 thereof adjacent to the contact portion 67. The downward movement of the spring arm brings the arcuate surface 72 against the edge surface 79 of the latch arm and, by virtue of the fact that the spring arm is stressed along its length and is flexed in its end portion 68, the free end of the spring arm will be resiliently biased against the edge 79 of the latch arm. Advantageously, the latch arm has a small lip 94 at its upper end which assists in retaining the spring arm in its flexed and latched condition. The spring arm can then be moved downwardly a further distance along the edge 79 when the substrate is positioned in the connector and crimped against the contact portions of the contact as shown in FIG. 4.

When the connector is placed in service, current will flow from the conductors 4 on the underside of the substrate 8 through the second or end portions 68 of the spring arms of the contacts and across the electrical interface at the ends of these spring arms to the lower portions of the latch arms. It will thus be apparent that a very short electrical path is provided between the terminals pads 4 and the yoke portions 52 of the terminals. Current will be discouraged from flowing through the spring arm of each terminal because of the length of this spring arm and the high resistance which will exist in it because of its length. The short path, of course, provides for a minimum of self-inductance effect in the circuit when the terminal is in use.

It will be apparent that a wide variety of specific terminal designs can be produced in accordance with the principles of the invention. By virtue of the fact that the mechanical function of developing the spring characteristics necessary for the contact force in the contact terminal are separated from the electrical function of transmitting the current from the contact portion of the terminal to the yoke portion or its equivalent, the spring arm can take any form which is required by the circumstances under which the terminal will be used. Thus, the spring arm could be of a more complex shape than that shown in the drawing and it could be somewhat longer than the arm shown. The contact force which is developed by the spring arm can further be controlled within precise limits because of the fact that the designer is free to design the spring arm such that it will achieve the desired contact force. The designer need not concern himself with the electrical characteristics of the terminal in his design of the spring arm.

Terminals in accordance with the invention can be made within wide varying dimensional limits, as required. One version of a terminal is substantially as shown in the drawing, is produced from sheet metal stock having thickness of 0.38 mm and is intended for use in a connector having a center-to-center spacing between adjacent terminals of 1.27 mm. The terminal used under these conditions has an overall height as measured from the lower edge of the yoke to the contact portion of about 3.6 millimeters, and has a length as measured between the contact arm and the reverse curve 62 of about 5.4 mm. These dimensions do not represent the lower limit of size which can be achieved when terminals are designed in accordance with the principles of the invention. It is entirely practical to produce terminals from metal stock having a thickness of about 0.17 mm which would be suited for use in connectors having a center-to-center spacing of adjacent erminals of 0.5 mm.

We claim:

1. An electrical contact terminal of the type having a contact portion which is intended to contact a mating contact means and spring means for maintaining said contact portion against said mating contact means, said terminal being of the complanate type having substantially all of its parts lying in a single plane, said terminal having a spring arm and a latch arm, said arms having free ends which are in overlapping latched relationship and which are held in a latched position by latching means which permits movement of said free end of said spring arm in one direction along said latch arm and which prevents movement of said free end of said spring arm in the opposite direction, said contact portion comprising contact edge portions of said spring arm, said terminal being characterized in that:

said latched position of said free end of said spring arm is a displaced position relative to the normal position of said free end of said spring arm, said normal position of said free end of said spring arm being adjacent to, and beyond, said free end of said latch arm, said spring arm being in a pre-stressed and flexed condition as a result of the displacement of said free end of said spring arm, and said free end of said spring arm being resiliently biased against said latch arm whereby, upon movement of said mating contact means against said contact portion of said spring arm, said free end of said spring arm is moved in said one direction along said latch arm with accompanying further flexing of said spring arm and with a resulting development of a predetermined contact force at the interface of said contact portion and said mating contact means and current flows from said contact portion through said interface thence through said latch arm.

2. An electrical contact terminal as set forth in claim 1, said terminal having been manufactured by stamping sheet metal stock, substantially all of the said parts of said terminal lying in the plane of the sheet metal stock from which said terminal was stamped.

3. A contact terminal as set forth in claim 2, said terminal being contained in a slot-like cavity in an electrical connector housing, said cavity having parallel sidewalls which are immediately adjacent to side surfaces of said terminal and which prevent lateral movement of said spring arm whereby said spring arm is maintained in said latched position.

4. A sheet metal contact terminal as set forth in claim 3, said terminal having a yoke portion, said latch arm and said spring arm extending from said yoke portion.

5. A sheet metal contact terminal as set forth in claim 4, said yoke portion having a solder tab extending therefrom.

6. A sheet metal contact terminal as set forth in claim 4, said latch arm and said spring arm extending from said yoke portion at spaced-apart locations, said spring arm having a first portion which extends arcuately away from said yoke portion to said contact portion, said spring arm being reversely curved at said contact portion and having a second portion which extends from said contact portion to said free end of said spring arm.

7. A sheet metal contact terminal as set forth in either of claims 1 or 6, said terminal having been manufactured by stamping said sheet metal stock and producing a blank having said free end of said latch arm integral with said free end of said spring arm, thereafter severing said blank along a severing line extending between said free end of said spring arm and said free end of said latch arm, and then flexing at least one of said arms and moving said at least one arm to position said spring arm in said displaced position.

8. A method of manufacturing an electrical contact terminal of the complanate type having substantially all of its parts lying in a single plane, said terminal further having a spring arm and a latch arm, said arms having free ends which are in overlapping latched relationship and which are held in a latched position by latching means which permits movement of said free end of said spring arm in one direction along said latch arm and which prevents movement of said free end of said spring arm in the opposite direction, said spring arm having a contact portion on edge portion thereof, said method comprising the steps of:

forming a flat blank for said contact terminal having said free end of said spring arm integral with said free end of said latch arm and having said free ends in non-overlapping relationship, severing said blank along a severing line which extends between said free end of said spring arm and said free end of said latch arm and which defines said latching means on said free ends of said arms, flexing at least one of said arms and displacing said at least one arm to position said free ends of said arm in said overlapping latched relationship whereby, said spring arm is in a preloaded condition and upon engagement of said contact portion of said spring arm by a mating contact means, a predetermined elevated contact force is established at the interface of said contact portion and said mating contact means.

9. A method as set forth in claim 8 in which said blank is produced by stamping sheet metal stock.

10. A method as set forth in claim 9 in which a multiplicity of terminals identical to said terminal are produced as a continuous strip.

11. A method as set forth in claim 10 in which said terminals in said strip are produced with said free ends of said arms integral, and said steps of severing said blank and displacing said at least one arm are carried out subsequent to stamping of said strip.

12. A method as set forth in claim 11 in which said terminals are severed from said strip and inserted into cavities in a connector housing, and said steps of severing said blank and displacing said at least one arm are carried out immediately prior to insertion.

* * * * *